(12) United States Patent
Hamada et al.

(10) Patent No.: US 7,485,690 B2
(45) Date of Patent: Feb. 3, 2009

(54) SACRIFICIAL FILM-FORMING COMPOSITION, PATTERNING PROCESS, SACRIFICIAL FILM AND REMOVAL METHOD

(75) Inventors: Yoshitaka Hamada, Joetsu (JP); Tsutomu Ogihara, Joetsu (JP); Motoaki Iwabuchi, Joetsu (JP); Takeshi Asano, Joetsu (JP); Takafumi Ueda, Joetsu (JP); Dirk Pfeiffer, Dobbs Ferry, NY (US)

(73) Assignees: Shin-Etsu Chemical Co., Ltd., Tokyo (JP); International Business Machines Corporation, Armonk, NY (US)

( * ) Notice: Subject to any disclaimer, the term of this patent is extended or adjusted under 35 U.S.C. 154(b) by 221 days.

(21) Appl. No.: 11/148,380

(22) Filed: Jun. 9, 2005

(65) Prior Publication Data
US 2005/0274692 A1 Dec. 15, 2005

(30) Foreign Application Priority Data
Jun. 10, 2004 (JP) ............................. 2004-172270

(51) Int. Cl.
*C08G 77/08* (2006.01)
(52) U.S. Cl. .............................. 528/12; 528/41; 528/39; 528/32
(58) Field of Classification Search ................... 528/12, 528/32, 39, 41
See application file for complete search history.

(56) References Cited

U.S. PATENT DOCUMENTS

| 6,268,457 B1 | 7/2001 | Kennedy et al. |
| 6,506,497 B1 | 1/2003 | Kennedy et al. |
| 6,873,387 B2 * | 3/2005 | Hokazono et al. ............ 349/137 |
| 7,202,013 B2 * | 4/2007 | Ogihara et al. ........... 430/270.1 |

FOREIGN PATENT DOCUMENTS

| JP | 2003-502449 A | 1/2003 |
| WO | WO-00/77575 A1 | 12/2000 |

* cited by examiner

*Primary Examiner*—Kuo-Liang Peng
(74) *Attorney, Agent, or Firm*—Birch, Stewart, Kolasch & Birch, LLP

(57) ABSTRACT

A sacrificial film-forming composition is provided comprising (A) a silicone resin which is a co-hydrolytic condensate of hydrolyzable silanes having formulae (1) and (2):

$$X\text{—}Y\text{—}SiZ_3 \quad (1)$$

$$R_nSiZ_{4-n} \quad (2)$$

wherein Z is a hydrolyzable group, X is a crosslinkable organofunctional group such as an unsubstituted hydroxyl group or a substituted or unsubstituted epoxy, acyloxy or acryloxy group, Y is a single bond or a divalent hydrocarbon group, R is hydrogen or a monovalent hydrocarbon group, and n is an integer of 0 to 3, the silicone resin being capable of crosslinking reaction by the crosslinkable organofunctional group in formula (1), (B) a crosslinking agent, (C) an acid generator, and (D) an organic solvent. The composition has improved storage stability, filling properties, adhesion and coating uniformity sufficient to form a sacrificial film which is effectively dissolvable in a stripping solution.

17 Claims, 2 Drawing Sheets

SACRIFICIAL FILM-FORMING COMPOSITION, PATTERNING PROCESS, SACRIFICIAL FILM AND REMOVAL METHOD

CROSS-REFERENCE TO RELATED APPLICATION

This Nonprovisional application claims priority under 35 U.S.C. §119(a) on Patent Application No. 2004-172270 filed in Japan on Jun. 10, 2004, the entire contents of which are hereby incorporated by reference.

TECHNICAL FIELD

This invention relates to a sacrificial film-forming composition having improved storage stability, filling properties and coating uniformity sufficient to form a sacrificial film, a patterning process, a sacrificial film formed from the composition, and a method of removing the sacrificial film.

BACKGROUND ART

To comply with the progress of semiconductor integrated circuits toward higher degrees of integration, a technology of processing to smaller feature sizes is needed. In the microfabrication technology of semiconductor devices of the next generation based on ULK/copper interconnection, a material-friendly processing technique is needed in order to make effective use of materials having insufficient chemical and physical strengths. In particular, the technique of processing porous silicon base low-dielectric materials having a relative permittivity of up to 2.7 requires engineers to review and tailor the steps in the overall process including cleaning, etching and CMP and to look for novel materials suited therefor.

For example, in connection with the dual-damascene manufacture by via-first process, Richard Spear et al. proposed spin-on-glass materials as the anti-reflective coating/filling material in JP-A 2003-502449, U.S. Pat. Nos. 6,268,457 and 6,506,497. Also a spin-on-glass material having no anti-reflective effect was proposed as the low-dielectric constant film-forming filling material. The spin-on-glass materials have a high structural similarity to the silica base low-dielectric constant film and raise no problem in pattern shape during fluorocarbon gas dry etching, but fail to establish a selectivity during wet etching and are difficult to control the shape after stripping. On the other hand, when organic materials are used as the filling material, they tend to generate shape abnormalities in proximity to the interface between the organic film and the low-dielectric constant film during fluorocarbon gas dry etching for low-dielectric constant material processing after the oxygen gas dry etching step.

SUMMARY OF THE INVENTION

An object of the present invention is to provide a novel sacrificial film-forming composition which can solve all the above-discussed problems in the processing of silicon-base low-dielectric constant film having a relative permittivity of up to 2.7, a patterning process using the composition, a sacrificial film formed from the composition, and a method of removing the sacrificial film.

The inventors recognized through the past investigations that a silicone base material provides a satisfactory etching selectivity relative to an organic material. However, among silicon base materials, silicone base materials are unlikely to establish a satisfactory selectivity therebetween especially on dry etching, and are difficult to establish a satisfactory selective ratio therebetween even on wet etching unless there is a substantial difference in degree of condensation. Even when a material having a low degree of condensation is used, the degree of condensation increases through the etching and baking steps so that a selective ratio of etching is not so high as expected.

Regarding resins composed mainly of silicone base materials, the inventors found that organofunctional groups are previously incorporated into siloxanes, and siloxanes having undergone polymerization to a certain extent are crosslinked together by utilizing those organofunctional groups, whereby storage stability is dramatically enhanced, as compared with the prior art spin-on-dielectric (SOD) type resins which undergo polymerization/crosslinking solely by way of siloxane bonds (see Japanese Patent Application No. 2003-157807). Continuing investigations, the inventors have discovered that due to the effect of organic structures introduced into silicone base materials by way of crosslinking, a selectivity is established between one and other silicone base materials especially on wet etching. The present invention is predicated on this discovery.

Accordingly, the present invention provides a sacrificial film-forming composition, a patterning process, a sacrificial film and a sacrificial film removing method, which are defined below.

[1] A sacrificial film-forming composition comprising (A) 100 parts by weight of an organofunctional silicone resin which is a co-hydrolytic condensate of hydrolyzable silanes having the general formulae (1) and (2) or a modification of the co-hydrolytic condensate, $$X\text{—}Y\text{—}SiZ_3 \qquad (1)$$

wherein Z is a hydrolyzable group such as an alkoxy, acetoxy, amino, alkylamino or halogen group; X is a crosslinkable organofunctional group such as a hydroxyl group which may be substituted with an acid or thermally labile functional group, a substituted or unsubstituted epoxy group, a substituted or unsubstituted acyloxy group or a substituted or unsubstituted acryloxy group, or a functional group which can be modified into such a crosslinkable organofunctional group; and Y is a single bond or a substituted or unsubstituted divalent (or trivalent when bonded to both two carbon atoms of an epoxy group) hydrocarbon group which may have an ether bond, ester bond or saturated cyclic structure in its structure, with the proviso that Y is not a single bond when X is a hydroxyl group, $$R_n SiZ_{4-n} \qquad (2)$$

wherein Z is a hydrolyzable group and may be identical with or different from Z in formula (1), R is hydrogen or a substituted or unsubstituted monovalent hydrocarbon group which does not undergo crosslinking reaction with other organic groups, and n is an integer of 0 to 3, the organofunctional silicone resin being capable of crosslinking reaction by the crosslinkable organofunctional group in formula (1) and having a weight average molecular weight of at least 500, (B) 0 to 20 parts by weight of a crosslinking agent, (C) 0.001 to 5 parts by weight of an acid generator, and (D) 100 to 10,000 parts by weight of an organic solvent.

[2] The composition of [1], wherein the crosslinking agent (B) is present in an amount of at least 1 part by weight per 100 parts by weight of component (A) and reacts with the crosslinkable organofunctional group in formula (1) in the presence of an acid catalyst to provide a curing ability to component (A).

[3] The composition of [1], wherein the crosslinkable organofunctional groups on one or more organofunctional silicone resins as component (A) provide a curing ability by inducing crosslinking reaction between identical or different silicone resins in the presence of an acid catalyst.

[4] The composition of any one of [1] to [3], wherein component (A) is a silicone resin which is obtained by combining a silane of formula (1) with a silane of formula (2) in such amounts that the amount of units derived from formula (1) is 0.5 to 7 mmol per gram of the resulting silicone resin, and subjecting the mixture to co-hydrolytic condensation.

[5] The composition of any one of [1] to [4], wherein in the co-hydrolytic condensate of silanes having formulae (1) and (2), which is component (A), the total of aromatic group-bearing units in both the silanes is up to 10 mol % of the overall units.

[6] The composition of any one of [1] to [4], wherein component (A) is an aromatic group-free silicone resin.

[7] A process of forming a pattern on a substrate by lithography, comprising the steps of:
applying the sacrificial film-forming composition of any one of [1] to [6] onto a substrate having a low-dielectric constant material film formed thereon,
baking the composition to form a sacrificial film,
forming an antireflective film on the sacrificial film,
applying a photoresist material,
prebaking the material to form a photoresist film,
exposing the photoresist film to a circuit pattern of light,
developing the photoresist film with a developer to form a resist pattern in the photoresist film,
etching the antireflective film, the sacrificial film and the low-dielectric constant material film through the resist pattern serving as a mask, and
dissolving away the sacrificial film in a stripping solution, thereby forming a pattern on the substrate.

[8] A process of forming a pattern on a substrate by lithography, comprising the steps of:
applying the sacrificial film-forming composition of any one of [1] to [6] onto a substrate having a low-dielectric constant material film formed thereon,
baking the composition to form a sacrificial film,
forming an antireflective film on the sacrificial film,
applying a photoresist material,
prebaking the material to form a photoresist film,
exposing the photoresist film to a circuit pattern of light,
developing the photoresist film with a developer to form a resist pattern in the photoresist film,
etching the antireflective film, the sacrificial film and the low-dielectric constant material film through the resist pattern serving as a mask,
effecting plasma treatment, and
dissolving away the sacrificial film in a stripping solution, thereby forming a pattern on the substrate.

[9] A process of forming a pattern on a substrate by lithography, comprising the steps of:
applying the sacrificial film-forming composition of any one of [1] to [6] onto a substrate having a low-dielectric constant material film formed thereon,
baking the composition to form a sacrificial film,
forming an antireflective film on the sacrificial film,
applying a photoresist material,
prebaking the material to form a photoresist film,
exposing the photoresist film to a circuit pattern of light,
developing the photoresist film with a developer to form a resist pattern in the photoresist film,
etching the antireflective film, the sacrificial film and the low-dielectric constant material film through the resist pattern serving as a mask,
heat treating for thermally decomposing organic crosslinks in the sacrificial film, and
dissolving away the sacrificial film in a stripping solution, thereby forming a pattern on the substrate.

[10] A process of forming a pattern on a substrate by lithography, comprising the steps of:
applying the sacrificial film-forming composition of any one of [1] to [6] onto a substrate having a low-dielectric constant material film formed thereon,
baking the composition to form a sacrificial film,
forming an antireflective film on the sacrificial film,
applying a photoresist material,
prebaking the material to form a photoresist film,
exposing the photoresist film to a circuit pattern of light,
developing the photoresist film with a developer to form a resist pattern in the photoresist film,
etching the antireflective film, the sacrificial film and the low-dielectric constant material film through the resist pattern serving as a mask,
effecting plasma treatment and then heat treatment, or effecting heat treatment and then plasma treatment, and
dissolving away the sacrificial film in a stripping solution, thereby forming a pattern on the substrate.

[11] A sacrificial film which is obtained by applying the sacrificial film-forming composition of any one of [1] to [6] onto a substrate and baking the composition.

[12] A method of removing a sacrificial film, comprising the step of treating the sacrificial film of [11] with an acidic or basic stripping solution for dissolving away the sacrificial film at a high selectivity relative to an underlying layer of low-dielectric constant material film.

The sacrificial film-forming composition of the invention has excellent storage stability, filling properties, adhesion, and coating uniformity, and forms a sacrificial film which is effectively dissolvable in a stripping solution. The composition is effective for increasing the precision during processing of ultra low-k (ULK) film.

DESCRIPTION OF THE PREFERRED EMBODIMENTS

Figure 1:
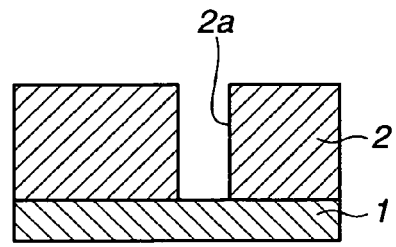
FIG. 1 is a cross-sectional view of a substrate having a patterned low-dielectric constant material film.

The silicone resin used herein is obtainable through co-hydrolysis and condensation of a hydrolyzable silicon compounds having the general formulae (1) and (2).

Herein Z is a hydrolyzable group such as an alkoxy, acetoxy, amino, alkylamino or halogen group; X is a crosslinkable organofunctional group such as a hydroxyl group which is substituted or not substituted with an acid or thermally labile functional group, a substituted or unsubstituted epoxy group, a substituted or unsubstituted acyloxy group or a substituted or unsubstituted acryloxy group, or a functional group which can be modified into such a crosslinkable organofunctional group; and Y is a single bond or a substituted or unsubstituted divalent (or trivalent when bonded to both two carbon atoms of an epoxy group) hydrocarbon group which may have an ether bond, ester bond or saturated cyclic structure in its structure, with the proviso that Y is not a single bond when X is a hydroxyl group.

Herein Z is a hydrolyzable group and may be identical with or different from Z in formula (1), R is hydrogen or a substituted or unsubstituted monovalent hydrocarbon group which does not undergo crosslinking reaction with other organic groups, and n is an integer of 0 to 3.

X is a functional group capable of crosslink-forming reaction utilizing as a catalyst the acid that is generated by the acid generator upon heating after the inventive composition is applied. Y is an organic group that links X to the silicon of a polymer chain. There can be a situation where two or more crosslinkable organofunctional groups are bonded to one Y. However, since no substantial change of handling is necessary from the technical aspect, the above definition is interpreted such that one crosslinkable organofunctional group is designated by X and the other crosslinkable organofunctional group is another substituent group. It should be technically understood that the crosslinking density, which will be described later, is calculated on the assumption that even when two crosslinkable organofunctional groups are bonded to one Y, one crosslink is formed.

Of the groups represented by X, the hydroxyl group which is substituted with an acid or thermally labile functional group is a functional group which is decomposed by heating to form a film after the sacrificial film-forming composition is applied, to regenerate a hydroxyl group which, in turn, can react with a crosslink-forming reactive group on another polymer or crosslinking agent, to form a crosslink. The protective group which is labile to acid or heat may be any of acid-decomposable protective groups which are commonly used in organic synthesis. Preferred protective groups are acetal and ketal groups, and typical examples include methoxymethyl, ethoxymethyl, propoxymethyl, isopropoxymethyl, butoxymethyl, t-butoxymethyl, cyclohexyloxymethyl, 1-ethoxyethyl, 1-methoxyethyl, 1-propoxyethyl, 1-isopropoxyethyl, 1-butoxyethyl, 1-t-butoxyethyl, 1-cyclohexyloxyethyl, 1-methoxy-1-propyl, 1-ethoxy-1-propyl, 1-propoxy-1-propyl, 1-isopropoxy-1-propyl, 1-butoxy-1-propyl, 1-t-butoxy-1-propyl, and 1-cyclohexyloxy-1-propyl. For 1,2- or 1,3-diol, ketal may be utilized, with a typical example being acetonide. In addition, tertiary alkyl groups may be used as the acid- or heat-labile protective group for hydroxyl group, with typical examples including t-butoxy, t-amyloxy, and neopentyloxy.

The epoxy group is a most preferred substituent group which has a high storage stability and readily reacts with lo another crosslinkable substituent group or epoxy group itself to form a crosslink. The epoxy group can be introduced at the end of a chain-like skeleton pendant from silicon, like a 2,3-epi-1-propoxy group. The epoxy group can also be introduced in the form of an epoxy group having a substituent group on the side thereof opposite to the silicon side, that is, at an intermediate of the pendant. When the epoxy group is introduced in such a chain-like form, the corresponding Y in formula (1) becomes a divalent organic group. Moreover, the epoxy group can be introduced into a cyclic skeleton bonded to silicon as a pendant or a cyclic skeleton bonded to silicon via a spacer, like an epoxycyclohexyl skeleton or epoxynorbornyl skeleton. When such an epoxy group introduced into a cyclic structure is represented by X, Y is a trivalent organic group.

The acyloxy groups include acetyl, propionyl, and butanecarboxy groups while t-butoxycarbonyloxy and analogues are useful.

The substituted or unsubstituted acryloxy groups include acrylic and methacrylic groups. The acryloxy groups may have substituent groups at alpha and beta-positions, and such substituent groups may bond together to form a ring.

The structure of Y is not particularly limited. Since it is undesired that the sacrificial film of the invention has a reduced etching rate when etched with a fluoride gas plasma, Y is preferably selected from aliphatic groups if not for the purpose of providing ultraviolet absorption. When a plasma treatment or thermal decomposition step, which will be described later, is added prior to the removal step in order that the sacrificial film layer be readily dissolved away, it is effective to add an amount of a ring structure-free silane so that the purpose may be attained under milder conditions. This is because in the case of plasma treatment, an increased carbon density enhances the plasma resistance of organic groups. In the case of thermal decomposition, the same effect is observed as a result of the instant research work. The additional requirement that is advantageous to thermal decomposition is that X is a hydroxyl or epoxy group. Another advantageous crosslinking reactive structure is an acrylic structure which is substituted or unsubstituted at the carbon of vinyl group on the carbonyl side.

On the other hand, if a cyclic structure is incorporated into Y, the resulting resin is believed to have a higher Tg, is easy to handle in synthesis and forms a film which is unsusceptible to intermixing. For this reason, a final composition for a particular application is determined after analysis of a number of combinations.

Functional groups of the following formulae are representative of the X—Y—Si structure in formula (1). Herein and throughout the specification, Me is methyl, Ac is acetyl, and Et is ethyl.

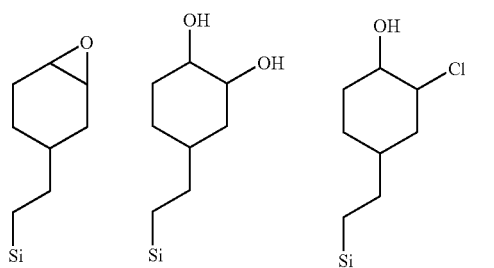
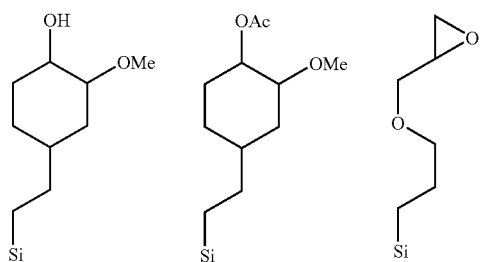
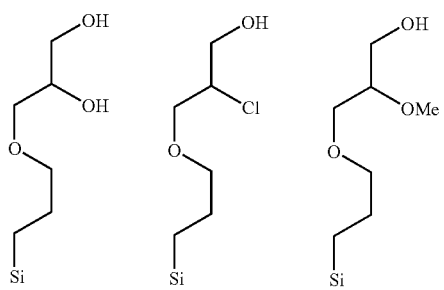
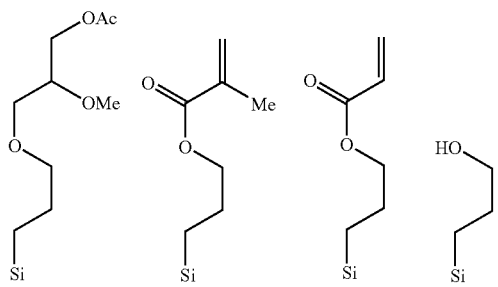
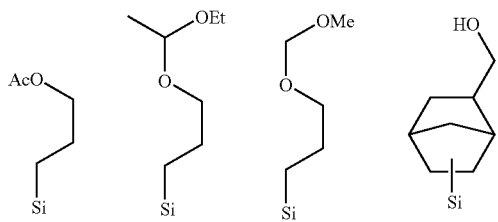
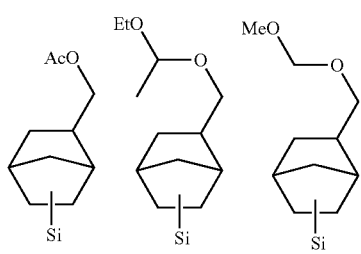
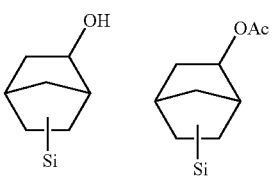

Structures of the following formulae are representative of the SiZ$_3$ structure in formula (1). Herein and throughout the specification, Pr is propyl, Bu is butyl, and tBu is tert-butyl.

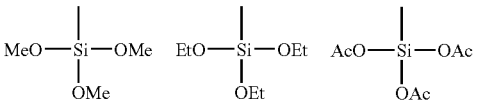
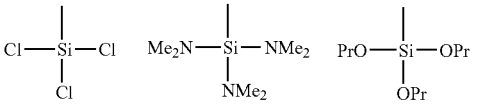

Specific examples of the hydrolyzable silicon compound of formula (1) include epoxysilanes, carbinol type silanes and silanes of the type whose hydroxyl group is protected, ester type silanes, ether type silanes, olefin type silanes, and derivatives thereof, as shown by the following formulae.

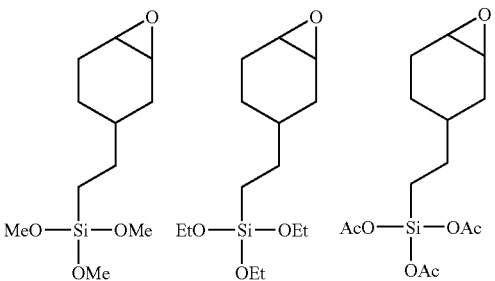
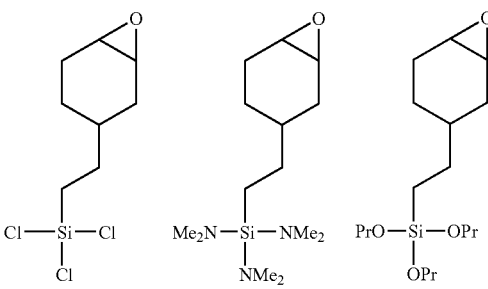

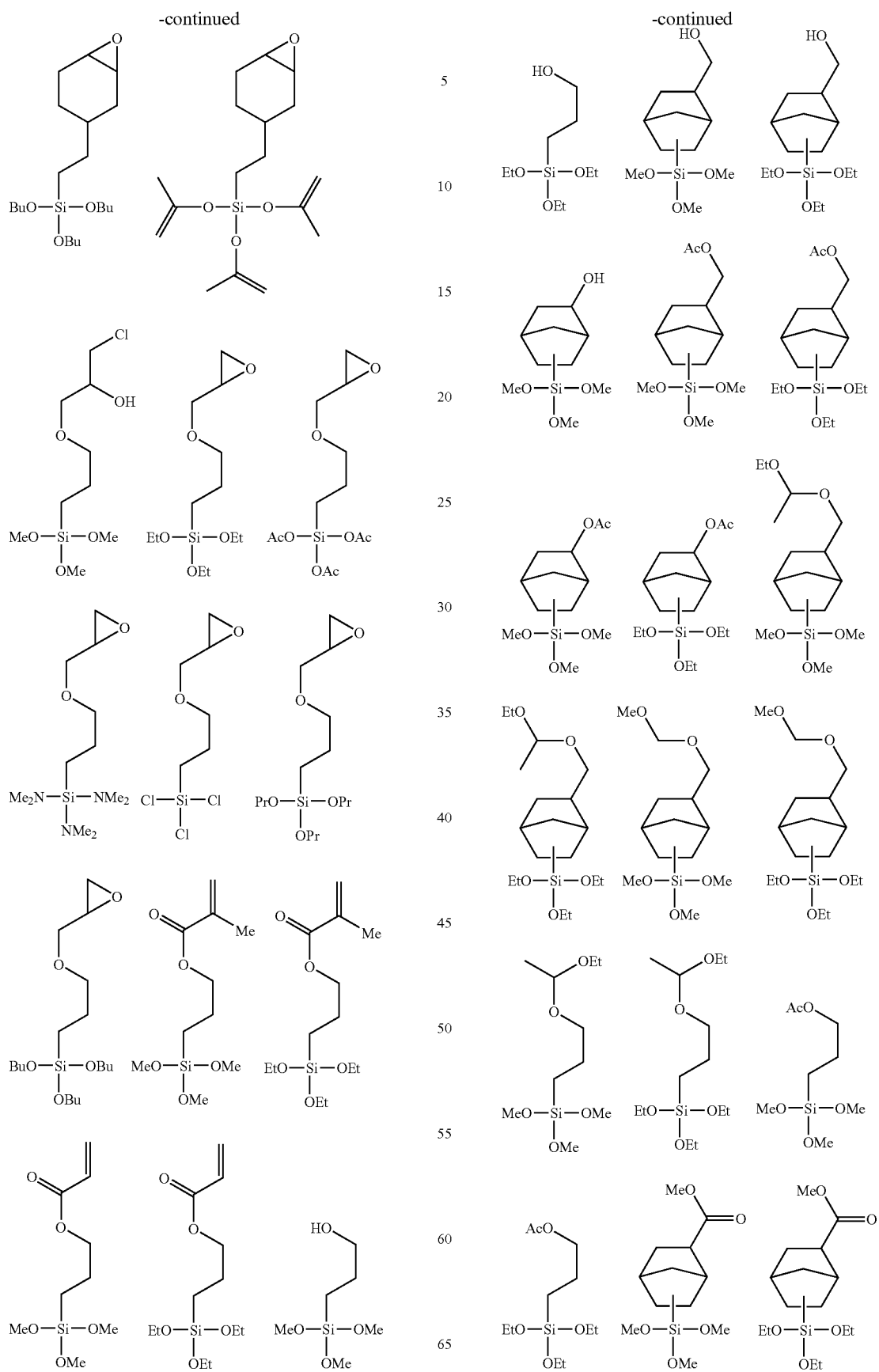

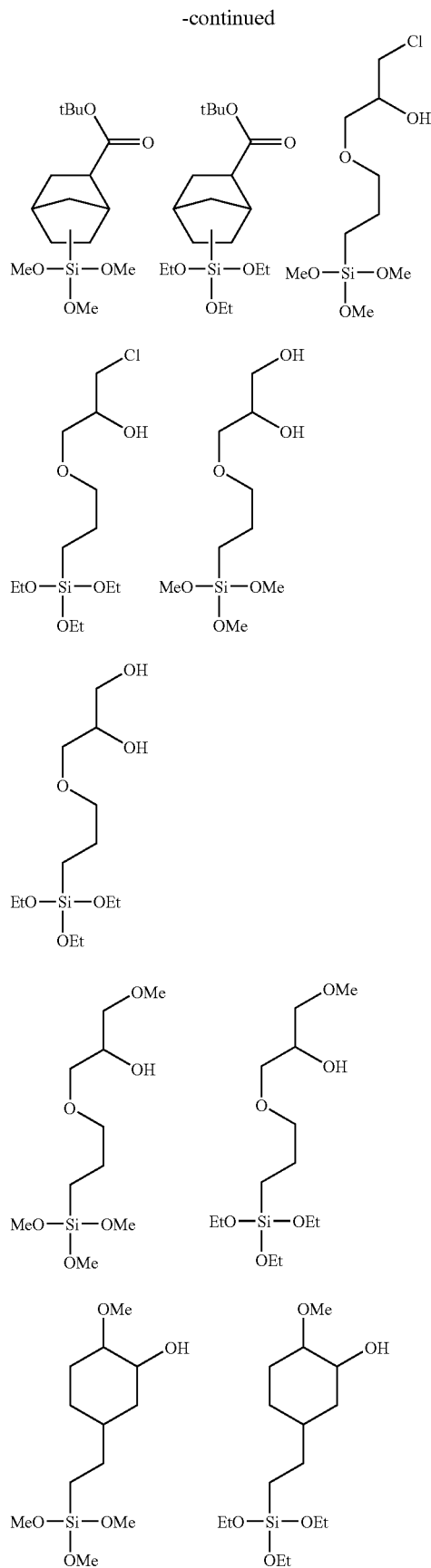

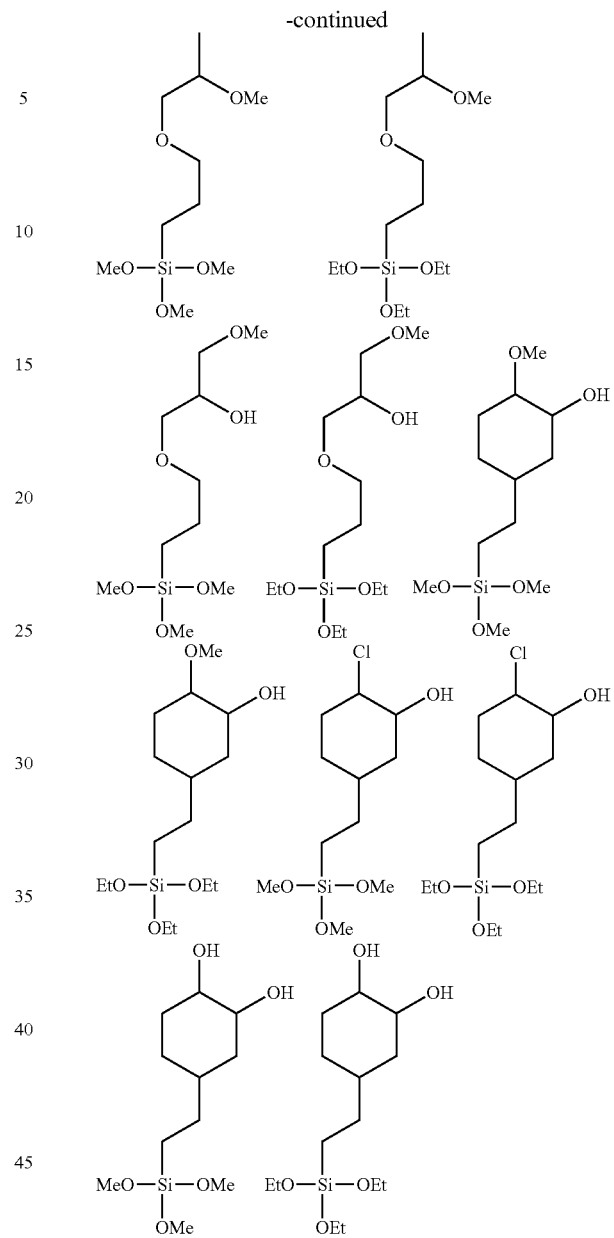

In the hydrolyzable silane compounds of formula (2), X is as defined above. R is hydrogen or a substituted or unsubstituted monovalent hydrocarbon group which does not undergo crosslinking reaction with other organic groups. The monovalent hydrocarbon group represented by R is not particularly limited as long as it is not active to crosslinking reaction by the acid and heat associated with film formation after the inventive composition is applied to a substrate (to be processed). In addition to a hydrogen atom and straight, branched or cyclic alkyl groups, a choice may also be made of alkyl groups having oxygen functional groups, such as alkyl groups substituted with alkoxy groups which are not thermally or acid labile, alkyl groups having halogen or cyano groups, and alkyl groups having silyl or siloxy groups.

The units of the general formula (2) are incorporated to prevent the phenomenon that if too much organic crosslinks form between silicone resins in a sacrificial film, the final step of dissolving the sacrificial film in a stripping solution becomes difficult. The structure of R affects the etching rate of the sacrificial film during dry etching. The dry etching for processing a silicon base low-dielectric constant material film with which the sacrificial film of the invention is most effectively utilized is generally carried out under conditions using a fluorochemical gas. With respect to the dry etching with fluorochemical gas, the sacrificial film of the invention preferably has an etching rate approximately equal to that of a low-dielectric constant material film, as will be described later. Then, if an aromatic compound is selected as R and R units are added in an amount of more than 10 mol % of the polymer constituent units (this critical amount varies with the molecular weight of another substituent group), the etching rate is substantially reduced below the required level. It is then preferred for both Y in formula (1) and R in formula (2), the total of aromatic group-bearing units be up to 10 mol % of the overall polymer. To fully meet the requirement for etching characteristics, it is desirable to exclude aromatic group-bearing units. Inversely, an R group substituted with an oxygen functional group such as an alkoxy group of not more than 4 carbon atoms achieves a favorable effect because it functions to enhance an etching rate as compared with an R group free of an oxygen functional group. Like the oxygen functional group, a fluorinated alkyl group also functions to enhance an etching rate. However, if R contains a fluorinated alkyl group alone, there is a risk of losing a balance among the free energy and other parameters of a film or failing to achieve adhesion to another layer. It is generally preferred to combine a fluorinated alkyl group with a group having an oxygen functional group.

R is hydrogen or substituted or unsubstituted monovalent hydrocarbon groups, typically alkyl groups of 1 to 20 carbon atoms, especially 1 to 15 carbon atoms, alkyl groups having an alkoxy group substituted at a position other than 1-position, and halogen-substituted alkyl groups.

Illustrative examples of the silane compound of formula (2), which has an oxygen functional group, include monofunctional silane compounds such as 3-methoxypropyldimethylmethoxysilane, 3-methoxypropyldimethylethoxysilane, 3-methoxypropyldimethylacetoxysilane, 3-ethoxypropyldimethylmethoxysilane, 3-ethoxypropyldimethylethoxysilane, 3-ethoxypropyldimethylacetoxysilane, 3-propoxypropyldimethylmethoxysilane, 3-propoxypropyldimethylethoxysilane, 3-propoxypropyldimethylacetoxysilane, (2,3-dimethoxypropyloxy)propyldimethylmethoxysilane, (2,3-dimethoxypropyloxy) propyldimethylethoxysilane, (2,3-dimethoxypropyloxy) propyldimethylacetoxysilane, (2-methoxypropyloxy) propyldimethylmethoxysilane, (2-methoxypropyloxy) propyldimethylethoxysilane, (2-methoxypropyloxy) propyldimethylacetoxysilane, etc.;

difunctional silane compounds such as 3-methoxypropylmethyldimethoxysilane, 3-methoxypropylmethyldiethoxysilane, 3-methoxypropylmethyldiacetoxysilane, 3-ethoxypropylmethyldimethoxysilane, 3-ethoxypropylmethyldiethoxysilane, 3-ethoxypropylmethyldiacetoxysilane, 3-propoxypropylmethyldimethoxysilane, 3-propoxypropylmethyldiethoxysilane, 3-propoxypropylmethyldiacetoxysilane, (2,3-dimethoxypropyloxy)propylmethyldimethoxysilahe, (2,3-dimethoxypropyloxy)propylmethyldiethoxysilane, (2,3-dimethoxypropyloxy) propylmethyldiacetoxysilane, (2-methoxypropyloxy) propylmethyldimethoxysilane, (2-methoxypropyloxy) propylmethyldiethoxysilane, (2-methoxypropyloxy) propylmethyldiacetoxysilane, etc.;

trifunctional silane compounds such as 3-methoxypropyltrimethoxysilane, 3-methoxypropyltriethoxysilane, 3-methoxypropyltriacetoxysilane, 3-ethoxypropyltrimethoxysilane, 3-ethoxypropyltriethoxysilane, 3-ethoxypropyltriacetoxysilane, 3-propoxypropyltrimethoxysilane, 3-propoxypropyltriethoxysilane, 3-propoxypropyltriacetoxysilane, (2,3-dimethoxypropyloxy)propyltrimethoxysilane, (2,3-dimethoxypropyloxy)propyltriethoxysilane, (2,3-dimethoxypropyloxy)propyltriacetoxysilane, (2-methoxypropyloxy)propyltrimethoxysilane, (2-methoxypropyloxy)propyltriethoxysilane, (2-methoxypropyloxy) propyltriacetoxysilane, etc.

Those silanes in which R is not substituted with an oxygen functional group are also useful as the units of formula (2). Typical examples of readily available silanes include monofunctional silane compounds such as trimethylchlorosilane, trimethylmethoxysilane, trimethylethoxysilane, trimethyldimethylaminosilane, trimethylacetoxysilane, phenyldimethylchlorosilane, phenyldimethylmethoxysilane, phenyldimethylethoxysilane, phenyldimethyldimethylaminosilane, phenyldimethylacetoxysilane, etc.;

difunctional silane compounds such as dimethyldichlorosilane, dimethyldimethoxysilane, dimethyldiethoxysilane, dimethyldiacetoxysilane, dimethylbis(dimethylamino)silane, phenylmethyldichlorosilane, phenylmethyldimethoxysilane, phenylmethyldiethoxysilane, phenylmethyldiacetoxysilane, phenylmethylbis(dimethylamino)silane, etc.;

trifunctional silane compounds such as methyltrimethoxysilane, methyltriethoxysilane, methyltrichlorosilane, methyltris(dimethylamino)silane, methyltripropoxysilane, methyltributoxysilane, ethyltrimethoxysilane, ethyltriethoxysilane, ethyltrichlorosilane, ethyltris(dimethylamino)silane, ethyltripropoxysilane, ethyltributoxysilane, propyltrimethoxysilane, propyltriethoxysilane, propyltrichlorosilane, butyltrimethoxysilane, butyltriethoxysilane, butyltrichlorosilane, phenyltrimethoxysilane, phenyltriethoxysilane, phenyltrichlorosilane, t-butyltrimethoxysilane, t-butyltriethoxysilane, t-butyltrichlorosilane, neopentyltrimethoxysilane, neopentyltriethoxysilane, neopentyltrichlorosilane, 3,3,3-trifluoropropyltrimethoxysilane, 3,3,3-trifluoropropyltriethoxysilane, 3,3,3-trifluoropropyltrichlorosilane, methyldichlorosilane, methyldimethoxysilane, methyldiethoxysilane, methyldiacetoxysilane, etc.;

tetrafunctional silane compounds such as trimethoxysilane, tetramethoxysilane, tetrachlorosilane, tetraacetoxysilane, tetrapropoxysilane, trichlorosilane, trimethoxysilane, triethoxysilane, etc.

A co-hydrolytic condensate can be synthesized by contacting a mixture of these hydrolyzable silane compounds with water to effect co-hydrolysis and condensation. The reaction may be effected in the presence of an acid catalyst or base catalyst. Also the reaction may be effected in an organic solvent. Examples of the acid catalyst which can be advantageously used in the reaction include hydrochloric acid, nitric acid, acetic acid, oxalic acid, sulfuric acid, methanesulfonic acid, p-toluenesulfonic acid, trifluoroacetic acid, trifluoromethanesulfonic acid, perchloric acid, phosphoric acid, and citric acid. Examples of the base catalyst include ammonia, methylamine, dimethylamine, ethylamine, diethylamine, triethylamine, sodium hydroxide, potassium hydroxide, tetramethylammonium hydroxide, tetrapropylammonium hydroxide, choline, diethylhydroxylamine, DBU and DBN. The organic solvent is preferably selected from polar solvents such as ethanol, IPA, MIBK, acetonitrile, DMA and DMF.

The co-hydrolytic condensate or silicone resin should have a weight average molecular weight (Mw) of at least 500, preferably 1,000 to 100,000, more preferably 2,000 to 10,000, as measured by GPC using polystyrene standards.

Too low a Mw interferes with film formation and crosslinking whereas too high a Mw interferes with dissolution.

For the silicone resin as component (A) according to the invention, the resin prepared by the aforementioned method may be modified prior to use. The modification means chemical conversion of functional groups on the resin to different functional groups. For example, for the purpose of controlling crosslinking reactivity, carboxylic acid is reacted with epoxy groups on the resin under basic conditions to convert to α-hydroxycarboxylate. In some examples, hydroxyl groups may be modified with an alkyl halide under basic conditions into non-crosslinkable alkyl ether groups. In a special example, non-crosslinkable 4-methoxybenzyloxy-alkyl groups may be modified under oxidizing conditions into crosslinkable hydroxyalkyl groups.

In the silicone resin as component (A) according to the invention which is a co-hydrolytic condensate of hydrolyzable silanes of formulae (1) and (2), the content of units derived from the silane of formula (1) significantly affects not only film formation and prevention of intermixing upon coating of an anti-reflective film, but also the dissolution in a stripping solution.

More particularly, once a sacrificial film is formed, an anti-reflective film is coated thereon. If the crosslinking density between silicone resins is too low, intermixing can take place between the sacrificial film and the anti-reflective coating composition, detracting from the function of anti-reflective film. The quantity of crosslinking necessary to prevent intermixing varies somewhat with the molecular weight of a silicone resin used, and, as a measure for implementation, is preferably such that the units derived from the silane of formula (1) are contained in an amount of at least 0.5 mmol, more preferably at least 1 mmol, per gram of the polymer.

On the other hand, the dissolution of the sacrificial film in a stripping solution lowers as the crosslinking quantity increases. To ensure a fully high dissolution rate relative to a silicon base low-dielectric constant material film on a substrate to be processed, the preferred content of the units derived from the silane of formula (1) is up to 3 mmol per gram of the polymer when the sacrificial film is dissolved away in a stripping solution without plasma or heat treatment prior to the stripping. A plasma treatment such as argon plasma treatment is effective for facilitating the dissolution of sacrificial film in a stripping solution. Then, when plasma treatment is followed by treatment with a stripping solution, the preferred content of the units derived from the silane of formula (1) is up to 6 mmol per gram of the polymer. Further, once organic groups are decomposed to some extent by carefully controlling heating conditions so as to prevent formation of ceramic SiC, advantageously the dissolution rate in a stripping solution can be preferentially enhanced. Then, when heat treatment is followed by treatment with a stripping solution, the preferred content of the units derived from the silane of formula (1) is up to 8 mmol per gram of the polymer, more preferably up to 7 mmol per gram of the polymer. It is noted that the term "per gram of the polymer" used in connection of the content of units refers to the composition of silane units in the raw materials on the hypothesis that all hydrolyzable groups on the silanes of formulae (1) and (2) are converted into Si—O—Si through co-hydrolytic condensation.

The crosslinking agent as component (B) is selected from compounds which are reactive with crosslinkable sites on component (A), that is, X (=organic crosslinkable groups) in formula (1). Note that the use of the crosslinking agent may be omitted if silicone resins are self-polymerizable as in the case where X is an epoxy, methacrylic or acrylic group, or silicone resins are organic crosslinkable with each other as in the case where X is a combination of two or more groups, such as a carboxylic acid group with a hydroxyl group, or an epoxy group with a hydroxyl group. Suitable crosslinking agents include compounds of the following formulae.

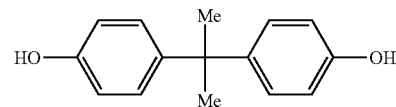

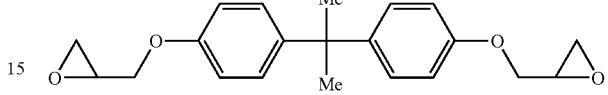

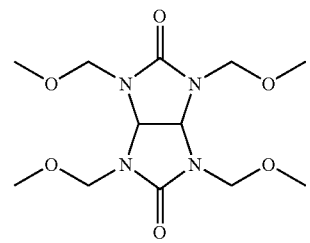

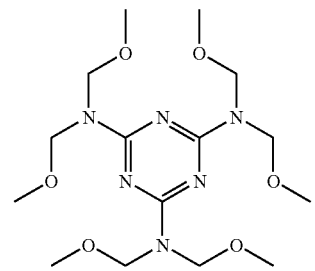

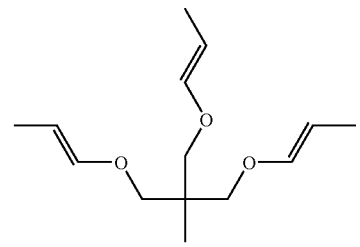

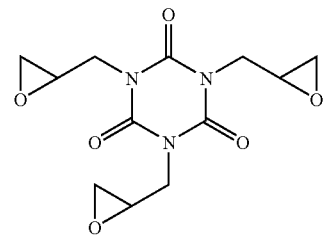

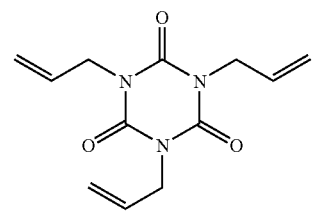

-continued

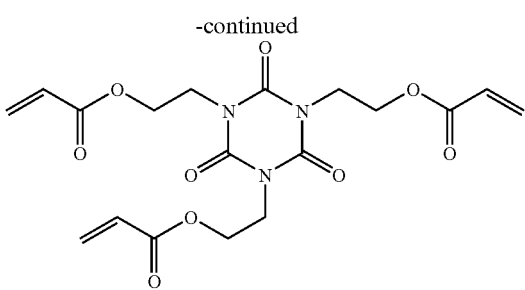

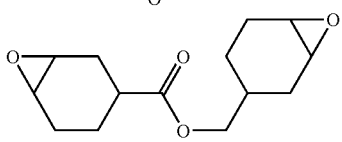

An appropriate amount of component (B) formulated is 0 to 20 parts by weight per 100 parts by weight of component (A).

The acid generator as component (C) is a compound which generates an acid upon heating, the acid serving as a catalyst for crosslinking reaction.

The acid generators used herein include onium salts, triazole derivatives, diazomethane derivatives, bissulfone derivatives, glyoximes, and sulfonic acid ester derivatives as shown below by general formulae, with those having a thermal decomposition temperature of up to 220° C. being preferred.

Onium Salts

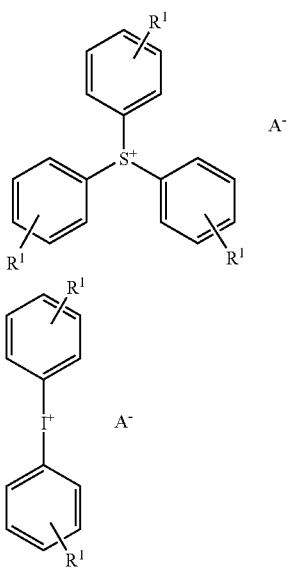

$R^1$ is hydrogen or an organic group such as alkyl or alkoxy.

Triazines

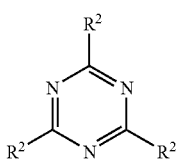

$R^2$ is a partially or entirely halogenated organic group such as alkyl.

Sulfonyldiazomethanes

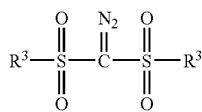

$R^3$ is an organic group.

Disulfones

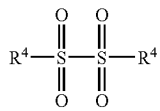

$R^4$ is an organic group such as aryl.

Oximesulfonates

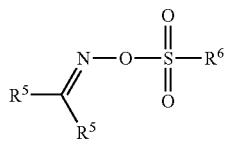

$R^5$ is an organic group, for example, an electron attractive group such as CN, sulfonyloxyimido, carbonyl, or an unsaturated group conjugated therewith, and $R^6$ is hydrogen or an organic group such as alkyl or alkoxy.

Imidosulfonates

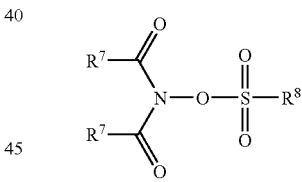

$R^7$ is a monovalent organic group or two $R^7$ bond together to form a ring, and $R^8$ is hydrogen or an organic group such as alkyl or alkoxy.

Of the foregoing formulae, the onium salts, especially triarylsulfonium salts are highly stable during storage and convenient to use among other acid generators. The aromatic groups substituting on the sulfur atom, which are not particularly limited, are preferably phenyl groups which are unsubstituted or optionally substituted with an alkyl or alkoxy group for increased solubility. The counter anions include fluorinated alkylsulfonic acids such as, preferably, trifluoromethanesulfonic acid, perfluorobutanesulfonic acid, perfluorooctanesulfonic acid, and perfluoro-4-ethylcyclo-hexanesulfonic acid; fluorinated arylsulfonic acids such as perfluorobenzenesulfonic acid; and fluorine-free sulfonic acids such as p-toluenesulfonic acid, butanesulfonic acid and camphorsulfonic acid. With respect to the substituent groups and counter anions, the same is applicable to the diaryliodonium salts (depicted on the right side). Since the diaryliodonium salts are less soluble in organic solvents, the aromatic groups substituting on the iodine atom preferably have alkyl groups substituted thereon.

Triazines substituted with halogenated alkyl groups are also useful as acid generators. In the above formula, $R^2$ is a partially or entirely halogenated alkyl group. Sulfonyldiazomethanes are also useful as acid generators. In the above formula, $R^3$ is a substituent group which may be either aromatic or aliphatic. Disulfones are also useful as acid generators. The substituent groups on disulfones are generally selected from aromatic groups. Oximesulfonates are also useful as acid generators. To ensure storage stability, the carbon which forms a double bond with nitrogen must be electron attractive. Compounds substituted with cyano, perfluoroalkyl or carbonyl groups and glyoxime sulfonate are preferably used. Imidosulfonates are also useful as acid generators. The imide side is often a cyclic imide which is easy to synthesize. Substituent group $R^8$ on the sulfonyl group may be selected from those described for the onium salts.

Typical acid generators are available as commercial reagents. Specific examples are given below by referring to product names in the product list of Midori Kagaku Co., Ltd.: TPS-105, TPS-102, TPS-103, TPS-109, MDS-103, MDS-105, MDS-109, MDS-205, BDS-109, DTS-102, DTS-103, DTS-105, DPI-105, DPI-106, DPI-109, DPI-201, BI-105, MPI-103, MPI-105, MPI-106, MPI-109, BBI-102, BBI-103, BBI-105, BBI-106, BBI-109, BBI-110, BBI-201, TAZ-100, TAZ-101, TAZ-102, TAZ-103, TAZ-104, TAZ-106, TAZ-107, TAZ-108, TAZ-109, TAZ-201,TAZ-203, TAZ-204, TAZ-110, TAZ-113, TA-118, TAZ-122, TAZ-123, TAZ-140, DAM-101, DAM-102, DAM-103, DAM-105, DAM-201, DAM-301, DAM-401, DS-100, DS-101, PAI-01, PAI-101, PAI-106, PAI-1001, NAI-100, NAI-1002NAI-1003, NAI-1004, NAI-101, NAI-105, NAI-106, NAI-109, NI-100, NI-1002, NI-1003, NI-1004, NI-101, NI-105, NI-106, NI-109, NDI-101, NDI-105, NDI-106, NDI-109, SI-101, SI-105, SI-106, SI-109, PI-105, PI-106, and PI-109.

An appropriate amount of component (C) formulated is 0.001 to 5 parts by weight, preferably 0.5 to 2 parts by weight, per 100 parts by weight of component (A).

In the inventive composition, an organic solvent is used as component (D). The organic solvent used herein is not particularly limited as long as it allows components (A) to (C) to be uniformly dissolved and preferably has a boiling point of up to 200° C. Examples include ethyl lactate (EL), propylene glycol monoethyl ether acetate (PGMEA), propylene glycol monoethyl ether (PGME), cyclohexanone, toluene, xylene, anisole, ethylene glycol, methyl isobutyl ketone (MIBK), and propylene glycol propyl ether (PnP).

An appropriate amount of component (D) formulated is 100 to 10,000 parts by weight, preferably 200 to 5,000 parts by weight, per 100 parts by weight of component (A).

In the composition of the invention, surfactants and other additives may be formulated if desired. A nonionic surfactant is preferred, examples of which include perfluoroalkyl polyoxyethylene ethanols, fluorinated alkyl esters, perfluoroalkylamine oxides, perfluoroalkyl EO-addition products, and fluorinated organosiloxane compounds. Illustrative examples include Fluorad FC-430 and FC-431 from Sumitomo 3M Ltd., Surflon S-141, S-145, KH-10, KH-20, KH-30 and KH-40 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Fluorad FC-430 from Sumitomo 3M Ltd., KH-20 and KH-30 from Asahi Glass Co., Ltd., and X-70-093 from Shin-Etsu Chemical Co., Ltd.

Referring to the figures, a process of forming a pattern using the sacrificial film-forming composition of the invention is described.

Figure 2:
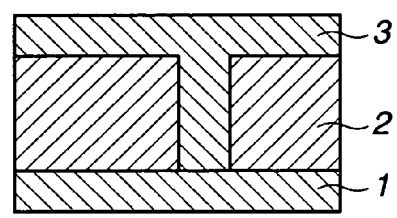
FIG. 2 is a cross-sectional view of a sacrificial film formed on the low-dielectric constant material film.

A low-dielectric constant material film 2 is formed on a planar substrate 1, a deep bore or channel 2a is opened in the film 2 by a conventional technique using photoresist, and the photoresist is peeled off. This results in the structure of FIG. 1. To process the low-dielectric constant material film 2 over a different area without damaging the substrate 1, the bore or channel 2a must be once filled as shown in FIG. 2. It is a sacrificial film 3 of the invention that serves to fill in the bore or channel 2a.

The sacrificial film 3 is formed by applying and baking the sacrificial film-forming composition of the invention. The thickness of the sacrificial film may be suitably selected and is generally in a range of 0.1 to 3.0 μm, preferably 0.5 to 1.0 μm. Preferred baking conditions include a temperature of 120 to 250° C. and a time of 30 seconds to 5 minutes.

Figure 3:
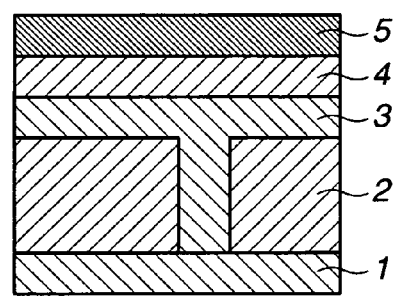
FIG. 3 is a cross-sectional view of an anti-reflective film and a photoresist film formed on the sacrificial film.

Next, as shown in FIG. 3, an anti-reflective film 4 is formed on the sacrificial film 3, and a photoresist material is then applied and prebaked to form a photoresist film 5. For the anti-reflective film 4 and the photoresist film 5, well-known materials may be used, the films may be formed by conventional techniques, and their thickness may be suitably selected.

Figure 4:
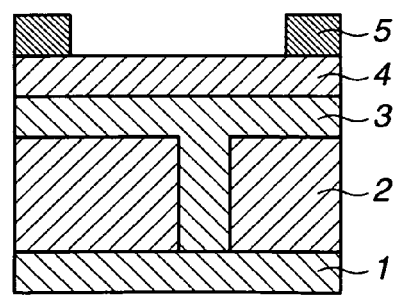
FIG. 4 is a cross-sectional view of a patterned photoresist film.
Figure 5:
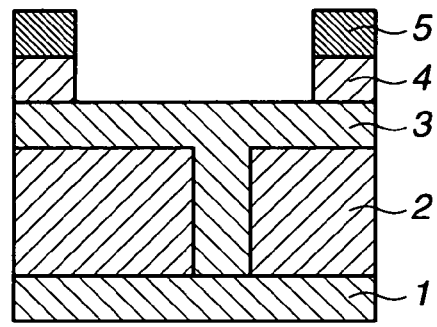
FIG. 5 is a cross-sectional view of a patterned anti-reflective film.

Then, the photoresist film 5 is exposed to a pattern of light in a conventional manner, and developed with a developer liquid to form a pattern in the photoresist film 5, as shown in FIG. 4. Then, as shown in FIG. 5, using the patterned photoresist film 5 as a mask, dry etching is carried out to form a pattern in the anti-reflective film 4.

Figure 6:
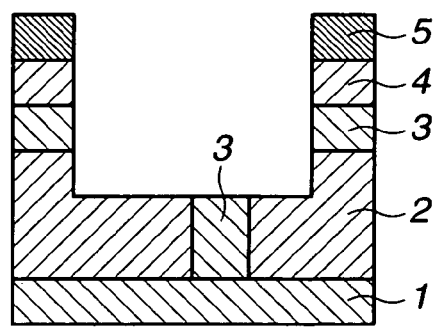
FIG. 6 is a cross-sectional view of a patterned sacrificial film/low-dielectric constant material film structure.

Next, as shown in FIG. 6, the sacrificial film 3 and low-dielectric constant material film 2 are dry etched to form a pattern therein. The dry etching used herein is preferably etching with a fluoride gas plasma. It will be understood that if the sacrificial film 3 and low-dielectric constant material film 2 have largely different etching rates during this process, a portion of the low-dielectric constant material film 2 in proximity to the bore or channel filled with the sacrificial film 3 cannot be processed to the designed depth as compared with the remaining portion. In this regard, it is preferred to match the etching rate of the sacrificial film by tailoring the carbon content, oxygen functional group and other parameters of the sacrificial film, or by introducing fluorine atoms. It is then preferred to select so the type and amount of components (A) and (B) in the sacrificial film-forming composition.

Figure 7:
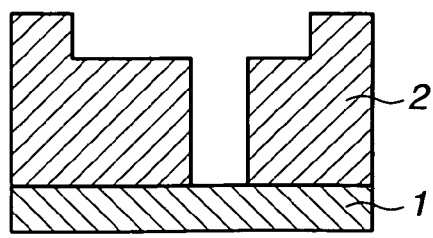
FIG. 7 is a cross-sectional view of a structure after the photoresist film, anti-reflective film and sacrificial film are removed.

Thereafter, as shown in FIG. 7, the residues of the photoresist film 5, anti-reflective film 4 and sacrificial film 3 are removed using a stripping solution. The stripping solution used herein may be either acidic or basic. Examples include dilute hydrofluoric acid, ammonium fluoride solution, buffer type hydrofluoric acid solution, EKC-680 and EKC-5920 by EKC Technologies, AP-811 by ATMI, trimethylammonium hydroxide solution, EKC-2255 by EKC Technologies, and ELM-C20-200 and ELM-R10 by Mitsubishi Gas Chemical Co., Ltd.

A sacrificial film in which the silicone resin has a reduced crosslinking density exhibits a fully high dissolution rate as compared with the low-dielectric constant material film without a need for special treatment prior to the treatment with a stripping solution, so that the sacrificial film can be dissolved away without damaging the low-dielectric constant material film. By contrast, a sacrificial film in which the silicone resin has an increased crosslinking density of about 3 mmol/gram of polymer is difficult to provide a sufficient differential dissolution rate unless a special treatment intervenes. As used herein, the term "crosslinking density" refers to the value based on the hypothesis that all hydrolyzable silanes used as polymer raw materials have been hydrolyzed to form Si—O—Si linkages and all crosslinkable groups incorporated have formed crosslinks. So this "crosslinking density" does not represent the actual physical amount in the film, but this value can be used as a measure of crosslinking.

One effective technique of establishing a differential dissolution rate is a plasma treatment that removes the organic component to some extent. For the plasma type, inert gases may be used, because treatment with an argon gas plasma, for example, is effective for increasing the reaction rate without inducing subordinate reactions. The use of plasma treatment can comply with a crosslinking density of up to about 6 mmol/gram of polymer, which suggests a possible choice of a sacrificial film which is unlikely to raise the problem of intermixing between the sacrificial film and the anti-reflective film.

A pretreatment which is done on the sacrificial film without damaging the low-dielectric constant material film and which is effective for establishing a differential dissolution rate in a stripping solution between the treated sacrificial film and the low-dielectric constant material film is heat treatment for decomposing organic crosslinks. In the event that the amount of units derived from the silane of formula (1) is up to 8 mmol, especially up to 7 mmol, per gram of the resin in a sacrificial film-forming composition, the dissolution rate of the sacrificial film in a stripping solution can be increased by heating at 180 to 400° C. within one hour. A heating temperature of higher than 400° C. may result in a lower dissolution rate than when heated in the temperature range, and such a lowering of dissolution rate is presumed as attributable to formation of ceramic SiC.

EXAMPLE

Preparation Examples, Working Examples and Comparative Examples are given below for illustrating the present invention. The invention is not limited to the Examples.

Preparation Example 1

A 500-ml flask was charged with 50 g of ultrapure water, 100 g of ethanol and 5 g of a 25% tetramethylammonium hydroxide aqueous solution. In a nitrogen atmosphere and at 40° C., a mixture of 38.13 g of (2,3-dimethoxypropoxy)propyl-trimethoxysilane and 3.55 g of glycidoxypropyltrimethoxy-silane was added dropwise over 25 minutes. After 4 hours of ripening, 1.65 g of acetic acid was added to the reaction solution for neutralization, from which ethanol and methanol were distilled off in a vacuum of 100 hPa. To the residue was added 200 g of ethyl acetate. The water layer was separated off, and the organic layer was washed with 100 g of ultrapure water, which procedure was repeated three times. To the organic layer was added 135 g of PGMEA. This solution was concentrated in a vacuum of 20 hPa, yielding 103.6 g of the solution. The nonvolatile content was 22.3 wt %. The silicone resin thus obtained had a weight average molecular weight of 2,244 as measured by GPC with polystyrene standards.

Preparation Example 2

A 500-ml flask was charged with 50 g of ultrapure water, 100 g of ethanol and 16 g of a 25% tetramethylammonium hydroxide aqueous solution. In a nitrogen atmosphere and at 40° C., a mixture of 30.29 g of (2-methoxypropoxy)propyl-trimethoxysilane and 6.67 g of acetoxypropyltrimethoxysilane was added dropwise over 25 minutes. After 4 hours of ripening, 1.65 g of acetic acid was added to the reaction solution for neutralization, from which ethanol and methanol were distilled off in a vacuum of 100 hPa. To the residue was added 200 g of ethyl acetate. The water layer was separated off, and the organic layer was washed with 100 g of ultrapure water, which procedure was repeated three times. To the organic layer was added 135 g of PGMEA. This solution was concentrated in a vacuum of 20 hPa, yielding 98.7 g of the solution. The nonvolatile content was 22.8 wt %. The silicone resin thus obtained had a weight average molecular weight of 2,080 as measured by GPC with polystyrene standards.

Preparation Example 3

A 500-ml flask was charged with 50 g of ultrapure water, 100 g of ethanol and 5 g of a 25% tetramethylammonium hydroxide aqueous solution. In a nitrogen atmosphere and at 40° C., a mixture of 21.3 g of (2,3-dimethoxypropoxy)propyl-trimethoxysilane and 12.4 g of 3,4-epoxycyclohexyl-ethyl-trimethoxysilane was added dropwise over 25 minutes. After 4 hours of ripening, 1.65 g of acetic acid was added to the reaction solution for neutralization, from which ethanol and methanol were distilled off in a vacuum of 100 hPa. To the residue was added 200 g of ethyl acetate. The water layer was separated off, and the organic layer was washed with 100 g of ultrapure water, which procedure was repeated three times. To the organic layer was added 135 g of PGMEA. This solution was concentrated in a vacuum of 20 hPa, yielding 123 g of the solution. The nonvolatile content was 20.0 wt %. The silicone resin thus obtained had a weight average molecular weight of 1,650 as measured by GPC with polystyrene standards.

Preparation Example 4

A 500-ml flask was charged with 50 g of ultrapure water, 100 g of ethanol and 45.8 g of a 25% tetramethylammonium hydroxide aqueous solution. In a nitrogen atmosphere and at 40° C., a mixture of 7.1 g of (2-methoxypropoxy)propyltrimethoxysilane and 32.3 g of 2-acetoxymethyl-bicyclo[2.2.1]heptanyltrimethoxysilane was added dropwise over 25 minutes. After 4 hours of ripening, 1.65 g of acetic acid was added to the reaction solution for neutralization, from which ethanol and methanol were distilled off in a vacuum of 100 hPa. To the residue was added 200 g of ethyl acetate. The water layer was separated off, and the organic layer was washed with 100 g of ultrapure water, which procedure was repeated three times. To the organic layer was added 150 g of PGMEA. This solution was concentrated in a vacuum of 20 hPa, yielding 135 g of the solution. The nonvolatile content was 17.0 wt %. The silicone resin thus obtained had a weight average molecular weight of 1,700 as measured by GPC with polystyrene standards.

Preparation Example 5

A 500-ml flask was charged with 50 g of ultrapure water, 100 g of ethanol and 34.7 g of a 25% tetramethylammonium hydroxide aqueous solution. In a nitrogen atmosphere and at 40° C., a mixture of 2.0 g of (2-methoxypropoxy)propyltrimethoxysilane, 20.1 g of 3,4-epoxycyclohexylethyltrimethoxysilane and 18.1 g of acetoxypropyltrimethoxysilane was added dropwise over 25 minutes. After 4 hours of ripening, 1.65 g of acetic acid was added to the reaction solution for neutralization, from which ethanol and methanol were distilled off in a vacuum of 100 hPa. To the residue was added 200 g of ethyl acetate. The water layer was separated off, and the organic layer was washed with 100 g of ultrapure water, which procedure was repeated three-times. To the organic layer was added 150 g of PGMEA. This solution was concentrated in a vacuum of 20 hPa, yielding 130 g of the solution. The nonvolatile content was 18.5 wt %. The silicone resin thus obtained had a weight average molecular weight of 1,800 as measured by GPC with polystyrene standards.

Examples 1-9

Sample Preparation

A coating composition was prepared by adding a crosslinker, acid generator and surfactant to each of the silicone resins prepared in Preparation Examples 1 to 5, according to the recipe shown in Table 1, and diluting with PGMEA. The coating composition was applied onto a silicon wafer and baked on a hot plate at 200° C. for 90 seconds, forming a sacrificial film of 0.20 μm thick.

The film thickness was measured using a meter M-2000V by J. A. Woollam.

The films were subjected to a dissolution test in a stripping solution.

TABLE 1

| | Silicone resin | Blending ratio | Cross-linker CEL2021 | Acid generator BBI-109 | Surfactant FC-430 |
|---|---|---|---|---|---|
| Example 1 | Preparation Example 1 | 100 | 0 | 0.5 | 1 |
| Example 2 | Preparation Example 1 | 100 | 0 | 1 | 1 |
| Example 3 | Preparation Example 1 | 100 | 10 | 1 | 1 |
| Example 4 | Preparation Example 2 | 100 | 10 | 0.5 | 1 |
| Example 5 | Preparation Example 2 | 100 | 5 | 1 | 1 |
| Example 6 | Preparation Example 2 | 100 | 10 | 1 | 1 |
| Example 7 | Preparation Example 3 | 100 | — | 1 | 1 |
| Example 8 | Preparation Example 4 | 100 | 10 | 1 | 1 |
| Example 9 | Preparation Example 5 | 100 | — | — | 1 |

FC-430: surfactant by 3M
BBI-109: tert-butylphenyliodonium nonaflate by Midori Kagaku Co., Ltd.
CEL2021: crosslinker by Daicel Chemical Industries, Ltd. of the formula:

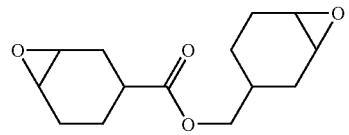

Comparative Example 1

A SOG sacrificial film-forming composition ACCUFILLT-28 (by Honeywell) was applied to a substrate and baked at 130° C. for 60 seconds and then at 200° C. for 60 seconds.

Comparative Example 2

A novolac sacrificial film-forming composition THMR-iP3300 (by Tokyo Ohka Kogyo Co., Ltd.) was applied to a substrate and baked at 100° C. for 90 seconds and then at 200° C. for 90 seconds.

Plasma Treatment

Using a plasma etching instrument TE-8500P by Tokyo Electron Co., Ltd., each sample was plasma treated under the following conditions.

| | |
|---|---|
| Chamber pressure: | 40 kPa |
| RF power: | 400 W |
| Gas: | argon |
| Time: | 20 sec |

Heat Treatment

Each sample was heated on a hot plate at 350° C. for 15 minutes.

Stripping Solution Dissolution Test

For each example, four samples were furnished: an untreated sample, a plasma-treated sample, a heat-treated sample, and a sample subjected to plasma treatment and subsequent heat treatment. Each sample was immersed in DHF (0.5% dilute hydrofluoric acid solution) at room temperature for 3 minutes or in EKC-2255 (EKC Technology, basic stripping solution) at 50° C. for 10 minutes. After the immersion, the sample was rinsed with pure water and dried. The results of stripping were judged as follows.

After the dissolution test, the thickness of residual film on the sample was measured. The sample was rated "◎" for a film thickness reduction of 90% or more, "○" for 89-50%, "Δ" for 49-5%, and "X" for 4% or less. The results are shown in Table 2.

TABLE 2

| | 0.5% DHF | | | | EKC-2255 | | | |
|---|---|---|---|---|---|---|---|---|
| Treatment | untreated | plasma | heat | plasma + heat | untreated | plasma | heat | plasma + heat |
| Example 1 | ○ | ○ | ◎ | — | ○ | ○ | ◎ | — |
| Example 2 | ○ | ○ | ◎ | — | ○ | ○ | ◎ | — |
| Example 3 | ○ | ○ | ◎ | — | ○ | ○ | ◎ | — |
| Example 4 | ○ | ○ | ◎ | — | ○ | ○ | ◎ | — |
| Example 5 | Δ | ○ | ○ | ◎ | Δ | Δ | ◎ | — |
| Example 6 | Δ | ○ | ○ | ◎ | Δ | Δ | ◎ | — |

TABLE 2-continued

|  | 0.5% DHF | | | | EKC-2255 | | | |
|---|---|---|---|---|---|---|---|---|
| Treatment | untreated | plasma | heat | plasma + heat | untreated | plasma | heat | plasma + heat |
| Example 7 | Δ | Δ | ○ | ◎ | Δ | Δ | ○ | ◎ |
| Example 8 | X | Δ | ○ | ◎ | X | Δ | ○ | ◎ |
| Example 9 | X | X | ○ | ◎ | X | X | ○ | ◎ |
| Comparative Example 1 | ○ |  | X |  | X |  |  |  |
| Comparative Example 2 | X |  | X |  | X |  |  |  |

As a reference in the above stripping test, a ULK film was prepared as follows.

A ULK film-forming composition was obtained by preparing a co-hydrolytic condensate of 75 parts by weight of methyltrimethoxysilane, 80 parts by weight of tetraethoxysilane, and 55 parts by weight of 3,4-epoxycyclohexylethyltrimethoxysilane, and dissolving 90 parts by weight of the co-hydrolytic condensate, 9 parts by weight of tetramethoxymethylglycoluril, and 1 part by weight of tert-butyliodonium camphorsulfonate in 900 parts by weight of PGMEA. The composition was applied onto a silicon wafer and heated at 200° C. for 120 seconds to form an ULK film having a k value of 2.7.

This film was treated with the two stripping solutions under the same conditions as above, but no film thinning was observed.

Example 10

To determine appropriate heat treatment conditions, a series of runs were carried out as above by heat treating the sample of Example 9 under different sets of conditions and immersing it in a stripping solution.
Heat treatment conditions: in air, (1) 180° C./15 min, (2) 300° C./15 min, (3) 350° C./15 min, and (4) 425° C./15 min
Stripping solution: EKC-2255 (EKC Technology, basic stripping solution)
Stripping conditions: immersed at 50° C. for 5 minutes
Measurement: a reduction of film thickness (nm/min)
The results are shown in Table 3.

TABLE 3

| Example 10 | |
|---|---|
| Heat treatment conditions | Film thickness reduction (nm/min) |
| 180° C./15 min | 0 |
| 300° C./15 min | 24 |
| 350° C./15 min | 36 |
| 425° C./15 min | 11 |

It is evident that heat treatment at 180° C. fails to facilitate stripping whereas heat treatment in the range of 300 to 350° C. facilitates stripping. On heat treatment at 425° C, stripping is lost again because the film becomes ceramic.

Japanese Patent Application No. 2004-172270 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A sacrificial film-forming composition comprising
(A) 100 parts by weight of an organofunctional silicone resin which is a co-hydrolytic condensate of hydrolyzable silanes having formulae (1) and (2),

wherein Z is a hydrolyzable group; X is a crosslinkable organofunctional group, or a functional group which can be modified into said crosslinkable organofunctional group X; and Y is a single bond or a substituted or unsubstituted divalent (or trivalent when bonded to both two carbon atoms of an epoxy group) hydrocarbon group which may have an ether bond, ester bond or saturated cyclic structure in its structure, with the proviso that Y is not a single bond when X is a hydroxyl group,
said organofunctional silicone resin being capable of crosslinking reaction by the crosslinkable organofunctional group in formula (1) and having a weight average molecular weight of at least 500, and said organofunctional silicone resin being an aromatic group-free silicone resin, wherein said co-hydrolytic condensate optionally contains at least one chemical modification selected from the group consisting of (1) reaction of carboxylic acid with epoxy groups on the resin to convert to α-hydroxycarboxylate, (2) reaction of hydroxyl groups with an alkyl halide into non-crosslinkable alkyl ether groups, and (3) reaction of non-crosslinkable 4-methoxybenzyloxyalkyl groups into crosslinkable hydroxyalkyl groups,
said silane of formula (2) is at least one selected from the group consisting of
3-methoxypropyldimethylmethoxysilane,
3-methoxypropyldimethylethoxysilane,
3-methoxypropyldimethylacetoxysilane,
3-ethoxypropyldimethylmethoxysilane,
3-ethoxypropyldimethylethoxysilane,
3-ethoxypropyldimethylacetoxysilane,
3-propoxypropyldimethylmethoxysilane,
3-propoxypropyldimethylethoxysilane,
3-propoxypropyldimethylacetoxysilane,
(2,3-dimethoxypropyloxy)propyldimethylmethoxysilane,
(2,3-dimethoxypropyloxy)propyldimethylethoxysilane,
(2,3-dimethoxypropyloxy)propyldimethylacetoxysilane,
(2-methoxypropyloxy)propyldimethylmethoxysilane,
(2-methoxypropyloxy)propyldimethylethoxysilane,
(2-methoxypropyloxy)propyldimethylacetoxysilane,
3-methoxypropylmethyldimethoxysilane,
3-methoxypropylmethyldiethoxysilane,
3-methoxypropylmethyldiacetoxysilane,
3-ethoxypropylmethyldimethoxysilane,
3-ethoxypropylmethyldiethoxysilane, 3-ethoxypropylmethyldiacetoxysilane,
3-propoxypropylmethyldimethoxysilane,
3-propoxypropylmethyldiethoxysilane,
3-propoxypropylmethyldiacetoxysilane,
(2,3-dimethoxypropyloxy)propylmethyldimethoxysilane,
(2,3-dimethoxypropyloxy)propylmethyldiethoxysilane,
(2,3-dimethoxypropyloxy)propylmethyldiacetoxysilane,
(2-methoxypropyloxy)propylmethyldimethoxysilane,
(2-methoxypropyloxy)propylmethyldiethoxysilane,
(2-methoxypropyloxy)propylmethyldiacetoxysilane,
3-methoxypropyltrimethoxysilane,
3-methoxypropyltriethoxysilane,
3-methoxypropyltriacetoxysilane,
3-ethoxypropyltrimethoxysilane,
3-ethoxypropyltriethoxysilane,
3-ethoxypropyltriacetoxysilane,
3-propoxypropyltrimethoxysilane,
3-propoxypropyltriethoxysilane,
3-propoxypropyltriacetoxysilane,
(2,3-dimethoxypropyloxy)propyltrimethoxysilane,
(2,3-dimethoxypropyloxy)propyltriethoxysilane,
(2,3-dimethoxypropyloxy)propyltriacetoxysilane,
(2-methoxypropyloxy)propyltrimethoxysilane,
(2-methoxypropyloxy)propyltriethoxysilane, and
(2-methoxypropyloxy)propyltriacetoxysilane,
(B) 0 to 20 parts by weight of a crosshnking agent,
(C) 0.001 to 5 parts by weight of an acid generator, and
(D) 100 to 10,000 parts by weight of an organic solvent.

2. The composition of claim 1, wherein the crosslinking agent (B) is present in an amount of at least 1 part by weight per 100 parts by weight of component (A) and reacts with the crosslinkable organofunctional group in formula (1) in the presence of an acid catalyst to provide a curing ability to component (A).

3. The composition of claim 1, wherein the crosslinkable organofunctional groups on one or more organofunctional silicone resins as component (A) provide a curing ability by inducing crosslinking reaction between identical or different silicone resins in the presence of an acid catalyst.

4. The composition of claim 1, wherein component (A) is a silicone resin which is obtained by combining a silane of formula (1) with a silane of formula (2) in such amounts that the amount of units derived from formula (1) is 0.5 to 7 mmol per gram of the resulting silicone resin, and subjecting the mixture to co-hydrolytic condensation.

5. A process of forming a pattern on a substrate by lithography, comprising the steps of:
applying the sacrificial film-forming composition of claim 1 onto a substrate having a low-dielectric constant material film formed thereon,
baking the composition to form a sacrificial film,
forming an antireflective film on the sacrificial film,
applying a photoresist material,
prebaking the material to form a photoresist film,
exposing the photoresist film to a circuit pattern of light,
developing the photoresist film with a developer to form a resist pattern in the photoresist film,
etching the antireflective film, the sacrificial film and the low-dielectric constant material film through the resist pattern serving as a mask, and
dissolving away the sacrificial film in a stripping solution, thereby forming a pattern on the substrate.

6. A process of forming a pattern on a substrate by lithography, comprising the steps of:
applying the sacrificial film-forming composition of claim 1 onto a substrate having a low-dielectric constant material film formed thereon,
baking the composition to form a sacrificial film,
forming an antireflective film on the sacrificial film,
applying a photoresist material,
prebaking the material to form a photoresist film,
exposing the photoresist film to a circuit pattern of light,
developing the photoresist film with a developer to form a resist pattern in the photoresist film,
etching the antireflective film, the sacrificial film and the low-dielectric constant material film through the resist pattern serving as a mask,
effecting plasma treatment, and
dissolving away the sacrificial film in a stripping solution, thereby forming a pattern on the substrate.

7. A process of forming a pattern on a substrate by lithography, comprising the steps of:
applying the sacrificial film-forming composition of claim 1 onto a substrate having a low-dielectric constant material film formed thereon,
baking the composition to form a sacrificial film,
forming an antireflective film on the sacrificial film,
applying a photoresist material,
prebaking the material to form a photoresist film,
exposing the photoresist film to a circuit pattern of light,
developing the photoresist film with a developer to form a resist pattern in the photoresist film,
etching the antireflective film, the sacrificial film and the low-dielectric constant material film through the resist pattern serving as a mask,
heat treating for thermally decomposing organic crosslinks in the sacrificial film, and
dissolving away the sacrificial film in a stripping solution, thereby forming a pattern on the substrate.

8. A process of forming a pattern on a substrate by lithography, comprising the steps of:
applying the sacrificial film-forming composition of claim 1 onto a substrate having a low-dielectric constant material film formed thereon,
baking the composition to form a sacrificial film,
forming an antireflective film on the sacrificial film,
applying a photoresist material,
prebaking the material to form a photoresist film,
exposing the photoresist film to a circuit pattern of light,
developing the photoresist film with a developer to form a resist pattern in the photoresist film,
etching the antireflective film, the sacrificial film and the low-dielectric constant material film through the resist pattern serving as a mask,
effecting plasma treatment and then heat treatment, or effecting heat treatment and then plasma treatment, and
dissolving away the sacrificial film in a stripping solution, thereby forming a pattern on the substrate.

9. A sacrificial film which is obtained by applying the sacrificial film-forming composition of claim 1 onto a substrate and baking the composition.

10. A method of removing a sacrificial film, comprising the step of treating the sacrificial film of claim 9 with an acidic or basic stripping solution for dissolving away the sacrificial film at a high selectivity relative to an underlying layer of low-dielectric constant material film.

11. The composition of claim 1, wherein said hydrolyzable group Z is an alkoxy, acetoxy, amino, alkylamino or halogen group.

12. The composition of claim 1, wherein said crosslinkable organofunctional group X is a hydroxyl group which may be substituted with an acid or thermally labile functional group, a substituted or unsubstituted epoxy group, a substituted or unsubstituted acyloxy group or a substituted or unsubstituted acryloxy group.

13. A sacrificial film-forming composition comprising
(A) 100 parts by weight of an organofunctional silicone resin which is a co-hydrolytic condensate of hydrolyzable silanes having formulae (1) and (2),
said organofunctional silicone resin being capable of crosslinking reaction by a crosslinkable organofunctional group in formula (1) and having a weight average molecular weight of at least 500, and said organofunctional silicone resin being an aromatic group-free silicone resin, wherein said co-hydrolytic condensate optionally contains at least one chemical modification selected from the group consisting of (1) reaction of carboxylic acid with epoxy groups on the resin to convert to α-hydroxycarboxylate, (2) reaction of hydroxyl groups with an alkyl halide into non-crosslinkable alkyl ether groups, and (3) reaction of non-crosslinkable 4-methoxybenzyloxyalkyl groups into crosslinkable hydroxyalkyl groups,
said silane of formula (1) is at least one selected from the group consisting of

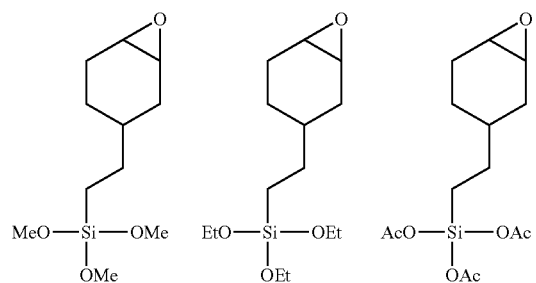

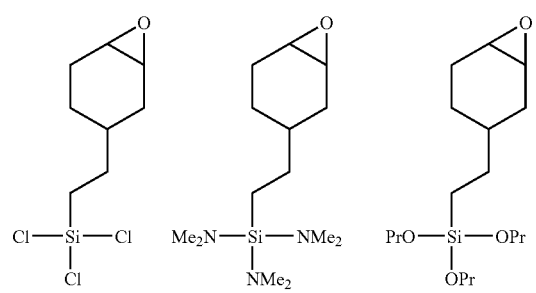

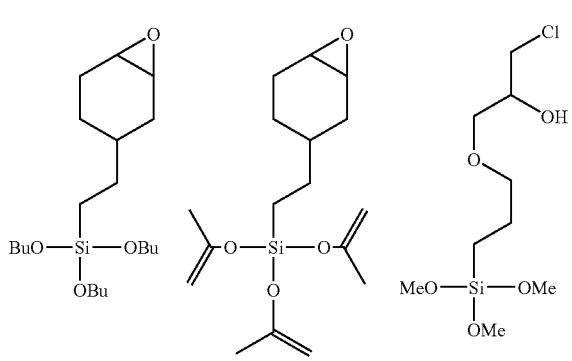

-continued

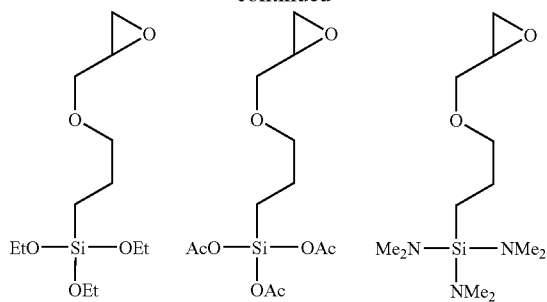

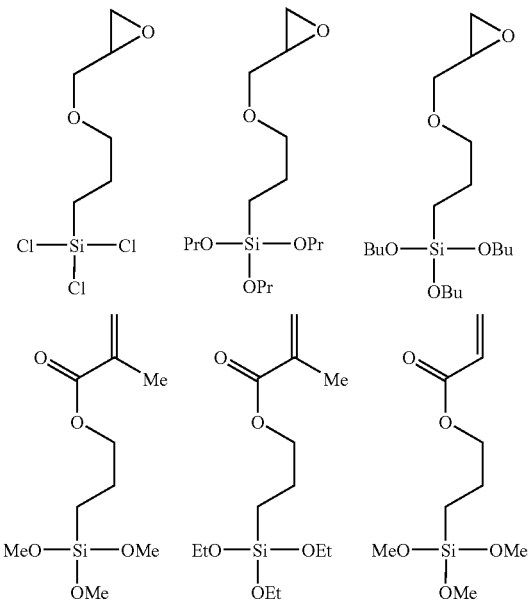

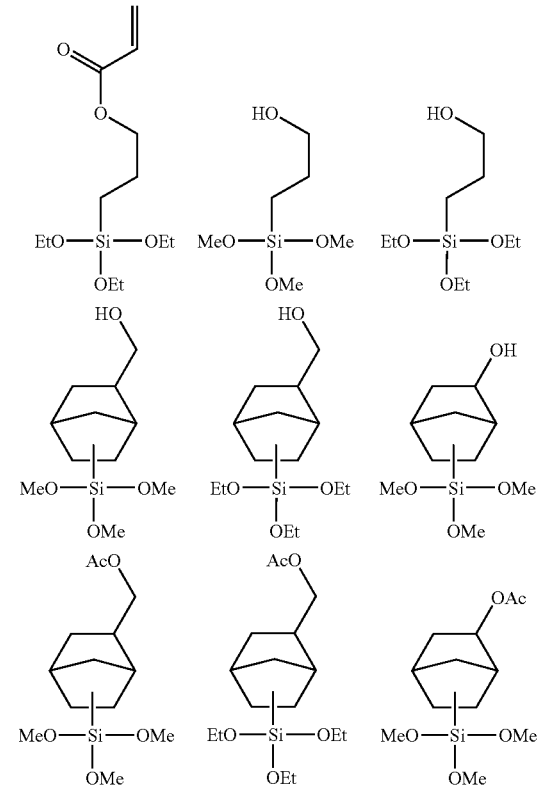

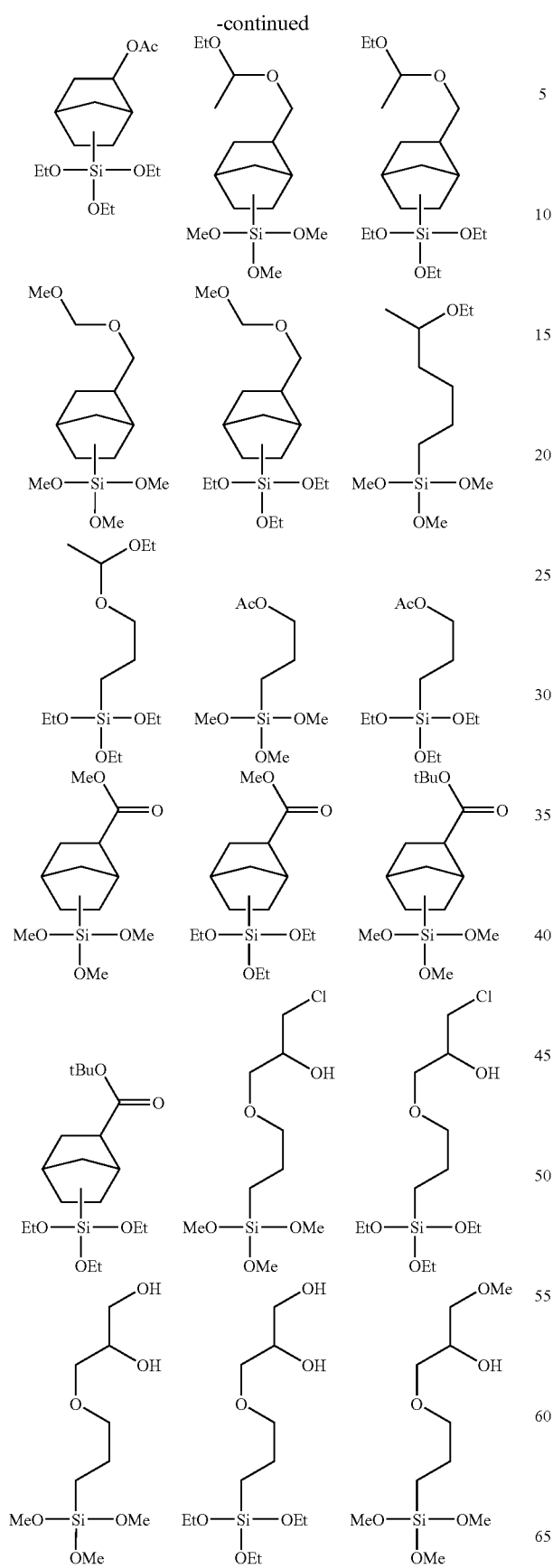
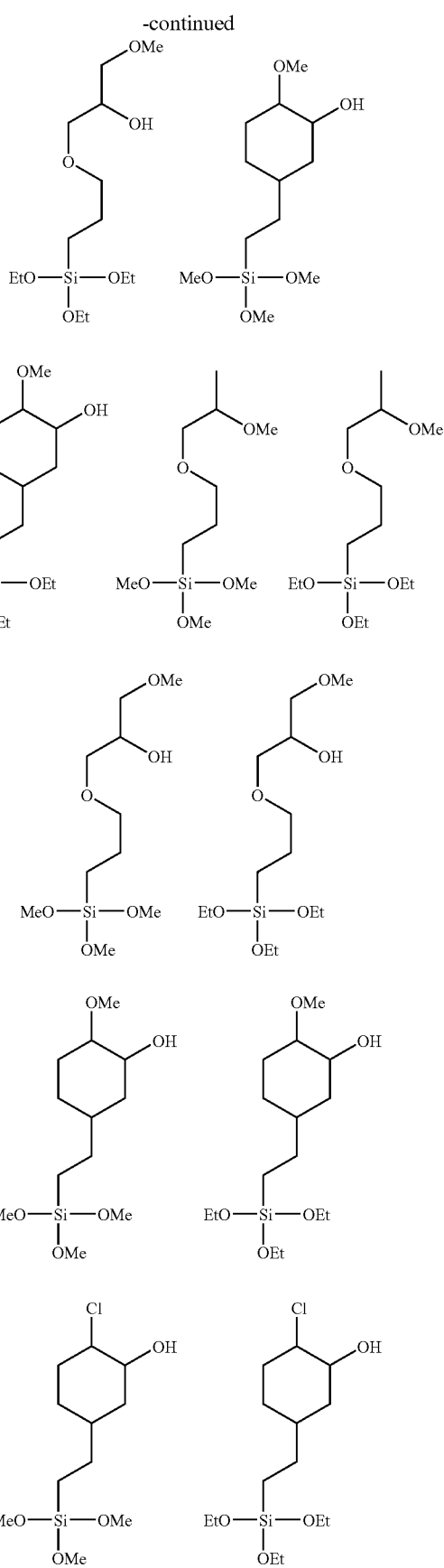

-continued

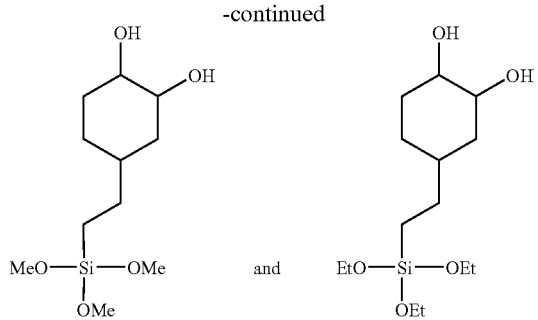

wherein Me is methyl, Ac is acetyl, and Et is ethyl, and said silane of formula (2) is at least one selected from the group consisting of
3-methoxypropyldimethylmethoxysilane,
3-methoxypropyldimethylethoxysilane,
3-methoxypropyldimethylacetoxysilane,
3-ethoxypropyldimethylmethoxysilane,
3-ethoxypropyldimethylethoxysilane,
3-ethoxypropyldimethylacetoxysilane,
3-propoxypropyldimethylmethoxysilane,
3-propoxypropyldimethylethoxysilane,
3-propoxypropyldimethylacetoxysilane,
(2,3-dimethoxypropyloxy)propyldimethylmethoxysilane,
(2,3-dimethoxypropyloxy)propyldimethylethoxysilane,
(2,3-dimethoxypropyloxy)propyldimethylacetoxysilane,
(2-methoxypropyloxy)propyldimethylmethoxysilane,
(2-methoxypropyloxy)propyldimethylethoxysilane,
(2-methoxypropyloxy)propyldimethylacetoxysilane,
3-methoxypropylmethyldimethoxysilane,
3-methoxypropylmethyldiethoxysilane,
3-methoxypropylmethyldiacetoxysilane,
3-ethoxypropylmethyldimethoxysilane,
3-ethoxypropylmethyldiethoxysilane,
3-ethoxypropylmethyldiacetoxysilane,
3-propoxypropylmethyldimethoxysilane,
3-propoxypropylmethyldiethoxysilane,
3-propoxypropylmethyldiacetoxysilane,
(2,3-dimethoxypropyloxy)propylmethyldimethoxysilane,
(2,3-dimethoxypropyloxy)propylmethyldiethoxysilane,
(2,3-dimethoxypropyloxy)propylmethyldiacetoxysilane,
(2-methoxypropyloxy)propylmethyldimethoxysilane,
(2-methoxypropyloxy)propylmethyldiethoxysilane,
(2-methoxypropyloxy)propylmethyldiacetoxysilane,
3-methoxypropyltrimethoxysilane,
3-methoxypropyltriethoxysilane,
3-methoxypropyltriacetoxysilane,
3-ethoxypropyltrimethoxysilane,
3-ethoxypropyltriethoxysilane,
3-ethoxypropyltriacetoxysilane,
3-propoxypropyltrimethoxysilane,
3-propoxypropyltriethoxysilane,
3-propoxypropyltriacetoxysilane,
(2,3-dimethoxypropyloxy)propyltrimethoxysilane,
(2,3-dimethoxypropyloxy)propyltriethoxysilane,
(2,3-dimethoxypropyloxy)propyltriacetoxysilane,
(2-methoxypropyloxy)propyltrimethoxysilane,
(2-methoxypropyloxy)propyltriethoxysilane, and
(2-methoxypropyloxy)propyltriacetoxysilane, (B) 0 to 20 parts by weight of a crosslinking agent,
(C) 0.001 to 5 parts by weight of an acid generator, and
(D) 100 to 10,000 parts by weight of an organic solvent.

14. The composition of claim 13, wherein the crosslinking agent (B) is present in an amount of at least 1 part by weight per 100 parts by weight of component (A) and reacts with the crosslinkable organofunctional group in formula (1) in the presence of an acid catalyst to provide a curing ability to component (A).

15. The composition of claim 13, wherein the crosslinkable organofunctional groups on one or more organofunctional silicone resins as component (A) provide a curing ability by inducing crosslinking reaction between identical or different silicone resins in the presence of an acid catalyst.

16. The composition of claim 13, wherein component (A) is a silicone resin which is obtained by combining a silane of formula (1) with a silane of formula (2) in such amounts that the amount of units derived from formula (1) is 0.5 to 7 mmol per gram of the resulting silicone resin, and subjecting the mixture to co-hydrolytic condensation.

17. A sacrificial film which is obtained by applying the sacrificial film-forming composition of claim 13 onto a substrate and baking the composition.

* * * * *